United States Patent [19]
Widener et al.

[11] Patent Number: 5,399,913
[45] Date of Patent: Mar. 21, 1995

[54] GATE-DRIVE CIRCUIT

[75] Inventors: Steven Widener, Raleigh; Eric Menzel, Wake Forest; Joseph C. Paulakonis, Chapel Hill; George W. Oughton, Jr., Raleigh, all of N.C.

[73] Assignee: Exide Elecronics Corp., Raliegh, N.C.

[21] Appl. No.: 939,311

[22] Filed: Sep. 2, 1992

[51] Int. Cl.[6] ........................ H02M 9/06; H03K 17/60
[52] U.S. Cl. .................................... 327/108; 307/107; 327/109
[58] Field of Search ............... 307/268, 570, 106, 107, 307/108, 270

[56] References Cited

U.S. PATENT DOCUMENTS

| | | | |
|---|---|---|---|
| 3,454,863 | 7/1969 | Hintz et al. | 307/108 X |
| 3,743,861 | 7/1973 | Bolmgren | 307/268 X |
| 4,329,595 | 5/1982 | Watson | 307/107 |
| 4,438,352 | 3/1984 | Mardkha | 307/475 |
| 4,484,084 | 11/1984 | Cheffer | 307/64 |
| 4,706,177 | 11/1987 | Josephson | 363/24 |
| 4,733,102 | 3/1988 | Nakayama et al. | 307/107 |
| 4,754,160 | 6/1988 | Ely | 307/64 |
| 4,766,328 | 8/1988 | Yang | 307/106 |
| 4,777,382 | 10/1988 | Reingold | 307/106 |
| 4,782,241 | 11/1988 | Baker et al. | 307/66 |
| 4,788,450 | 11/1988 | Wagner | 307/64 |
| 4,841,160 | 6/1989 | Yon et al. | 307/66 |
| 4,870,555 | 9/1989 | White | 363/21 |
| 4,937,468 | 6/1990 | Shekhawat et al. | 307/268 |
| 5,055,722 | 10/1991 | Latos et al. | 307/270 X |
| 5,164,892 | 11/1992 | Kimbara | 363/131 |
| 5,220,204 | 6/1993 | Burkhead | 307/268 |

OTHER PUBLICATIONS

IXYS Corporation, Preliminary Information Data Sheet No. SJ90537E, Jun. 1990, "Isosmart Half Bridge Driver Chipsets".
"A Novel Drive Circuit For Power MOSFETS," Falah Al–hosini et al., PCI, Oct. 1985 Proceedings, pp. 33–44.
HV400 Preliminary–High Speed MOSFET Driver, File No. 2850, May 1991.

*Primary Examiner*—Willis R. Wolfe, Jr.
*Attorney, Agent, or Firm*—Woodcock Washburn Kurtz Mackiewicz & Norris

[57] ABSTRACT

A gate-drive circuit (10) is an interface between a clock (12) and control circuit (14) and a circuit (16) comprising an isolated gate bipolar transistor (IGBT) devices. The clock (12) provides two complementary clock signals (CLK1, CLK2) to the gate-drive circuit (10); the control circuit provides a signal (ENABLE) for turning the gate-drive circuit on and off, and the gate-drive circuit outputs isolated supply voltages (+RAIL, −RAIL), a drive signal (GATE), and a common reference signal (EMITTER). The control signal is sent across an isolation boundary via a 2-MHz push-pull converter in the gate-drive circuit (10). A transformer (T1) in the gate-drive circuit provides the isolation boundary. The power required to switch the IGBT device (16) is sent through the same 2-MHz converter. The secondary of the 2-MHz push-pull transformer (T1) is referenced to the IGBT emitter. As the primary side circuitry receives "on" signals from the control board (14), the converter runs and charges secondary-side bulk storage capacitors (C16, C18) in the gate-drive circuit. The gate voltage of the IGBT device is held off until the bulk storage capacitors are charged to a minimum value. When the capacitors have charged, the IGBT gate is turned on as the signal is received from the push-pull converter. The gate is then turned off by a negative voltage when the signal received from the converter is removed.

13 Claims, 5 Drawing Sheets

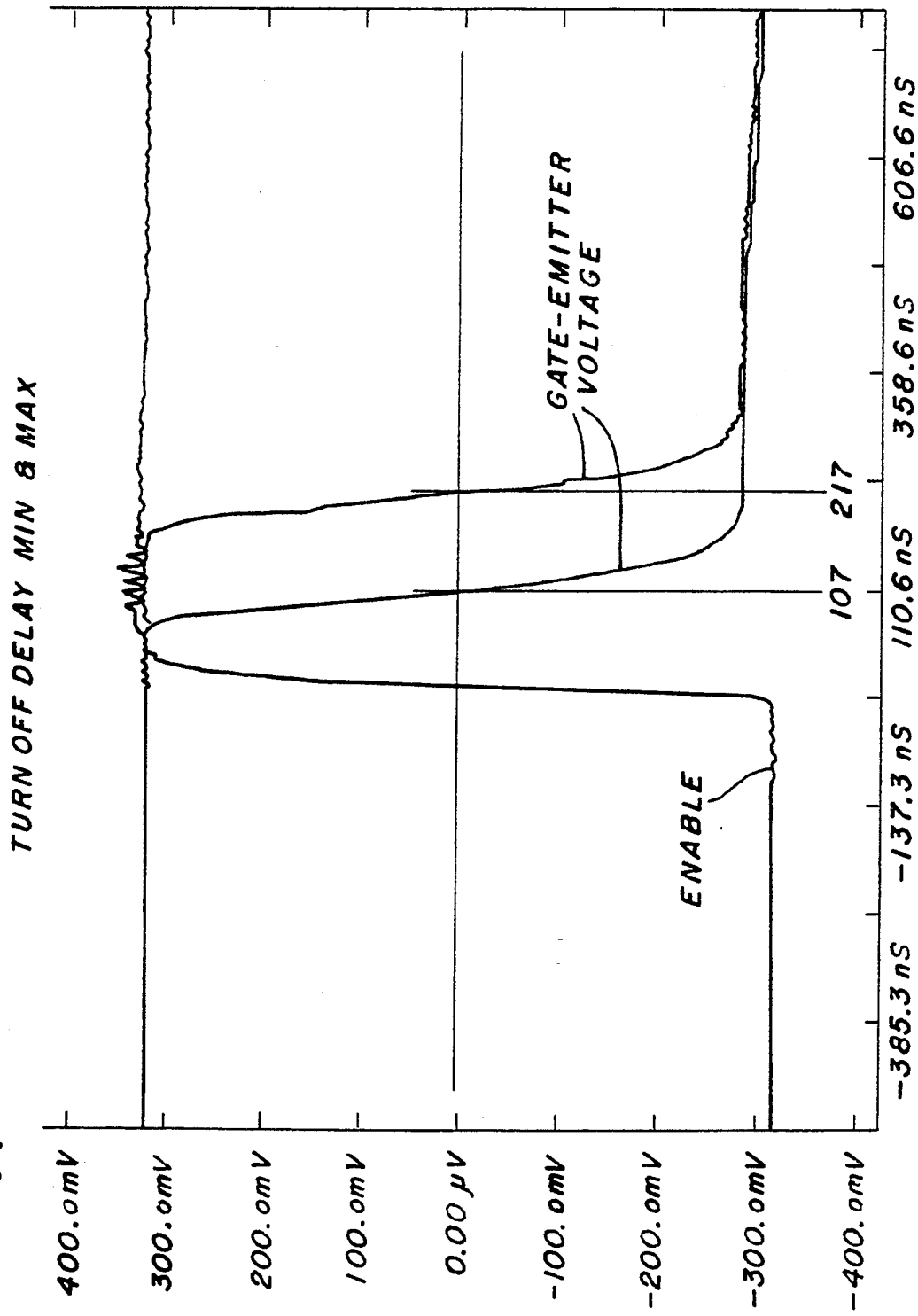

GATE-DRIVE CIRCUIT

FIELD OF THE INVENTION

The present invention generally relates to power supplies, and more particularly relates to isolated gate-drive circuits.

BACKGROUND OF THE INVENTION

Designers of power drives for PWM Motor Controls and switching power supplies typically face the problem of driving a high-side MOSFET transistor in a high voltage power stage. A common technique used in high-side drive circuits is to generate an isolated auxiliary supply voltage. This supply voltage provides power to a conventional gate-drive circuit. The average auxiliary power consumed is generally well below 1 watt, and varies with switching frequency, FET size and number of paralleled FETs used to configure one switch.

Typically, an opto-coupler is used to translate the switch activation command from a ground referenced, or low-side, control circuit up to the high-side driver. This technique, however, creates reliability problems, including low common mode transient immunity, and performance degradation over time and temperature. In addition, high voltage MOSFET circuit slew rates can easily exceed 20 kV/$\mu$s, causing opto-coupler self-turn-on or turn-off. The opto-coupler's AC common mode rejection must be carefully evaluated, as this characteristic is typically influenced by common mode voltage as well as dV/dt. Power up and power down sequences also present potential failure without undervoltage lockout circuitry. See Unitrode Application Note U-127, entitled *Unique Chip Pair Simplifies Isolated High Side Switch Drive*.

One shortcoming of many prior art gate-drive circuits is that a separate DC power supply is required. Further shortcomings are that many prior art circuits are too expensive, have too many parts, are limited to a 50% duty cycle and/or perform poorly. In addition, most gate-drive ICs do not provide negative turn-off voltage, which would provide noise immunity if available.

SUMMARY OF THE INVENTION

Accordingly, a goal of the present invention is to provide a gate-drive circuit that does not require an isolated (extra cost) DC supply to operate. A further goal of the invention is to provide a low cost, high performance gate-drive circuit without a duty cycle limitation. Another goal of the invention is to provide a gate-drive circuit that can provide negative turn-off voltage. Briefly, preferred embodiments of the present invention provide signal and power through a single isolation transformer. Moreover, many desirable performance characteristics are provided with a low parts count and at low cost.

One embodiment of the present invention comprises a push-pull converter and a gate-drive secondary circuit. The push-pull converter in this embodiment comprises: (i) first and second gates, (ii) a transformer comprising a primary side operatively coupled to the first and second gates and a secondary side, (iii) a rectifier operatively coupled to the secondary side, and (iv) first and second storage capacitors (C16, C18) coupled to the rectifier so as to receive charge when the converter is operating and provide positive and negative supply rails. The gate-drive secondary circuit comprises first and second transistors (Q4, Q5) arranged in an emitter-follower configuration to provide a gate-drive output signal. The first transistor is coupled to the positive supply rail and the second transistor is coupled to the negative supply rail.

In preferred embodiments of the invention, the gate-drive secondary circuit further comprises a third transistor (Q1) operatively coupled to the first and second transistors and to the transformer, a fourth transistor (Q2) operatively coupled to the first and second transistors and to the positive and negative supply rails, a fifth transistor (Q3) operatively coupled between the positive and negative supply rails and to the first, second, third and forth transistors, and a Zener diode (D5) having a predetermined Zener breakdown voltage and coupled between the fifth transistor and the transformer. The Zener diode is arranged to prevent the fifth transistor from turning on when the voltage on the supply rails is less than the Zener voltage.

In preferred embodiments of the invention, the transformer includes center taps on the primary and secondary sides. The primary-side center tap is coupled to a fixed voltage and the secondary-side center tap is coupled to a cathode of the first storage capacitor and an anode of the second storage capacitor. In addition, the secondary-side center tap provides a common reference voltage (EMITTER).

The first and second gates may be NOR gates. In addition, the push-pull converter may further comprise (i) transistors coupled between the outputs of each of the NOR gates and respective terminals of the primary side of the transformer, and (ii) diodes (D6, D7) coupled between a collector and emitter of each of the transistors. Further, the push-pull converter may advantageously be arranged to receive a first clock signal (CLK1) into a first input terminal of the first NOR gate, a second clock signal (CLK2) into a first terminal of the second NOR gate, and a control signal (ENABLE) into a second input terminal of each of the first and second NOR gates, and to generate first and second square waves that follow the first and second clock signals when the control signal is in a predetermined state.

The present invention also encompasses gate-drive systems. One embodiment of a gate-drive system in accordance with the invention comprises clock means for generating first and second complementary clock signals, a control circuit comprising means for generating a control signal, and a gate-drive circuit, coupled to the clock means and control circuit. The gate-drive circuit includes a push-pull converter comprising square wave means for receiving the first and second clock signals and the control signal and generating first and second square waves that follow the first and second clock signals when the control signal is in a predetermined state; a transformer comprising a primary side operatively coupled to the square wave means and a secondary side; a rectifier operatively coupled to the secondary side of the transformer; and first and second storage capacitors coupled to the rectifier so as to receive charge when the converter is operating and provide positive and negative supply rails. In addition, the gate-drive circuit includes a gate-drive secondary circuit comprising first and second transistors arranged in an emitter-follower configuration and providing a gate-drive output signal. The first transistor is coupled to the positive supply rail and the second transistor is coupled to the negative supply rail.

In preferred embodiments, the clock means comprises an oscillator and first and second flip-flops. The oscillator has an output terminal coupled to a clock input of the first flip-flop, a Q output of the first flip-flop is coupled to a clock input of the second flip-flop, and Q and Q-not outputs of the second flip-flop provide the first and second complementary clock signals.

In addition, in preferred embodiments the square wave means comprises a push-pull converter comprising first and second NOR gates, transistors coupled between the outputs of each of the NOR gates and respective terminals of the primary side of the transformer, and diodes coupled between a collector and emitter of each of the transistors. The push-pull converter is arranged to receive the first clock signal into a first input terminal of the first NOR gate, the second clock signal into a first terminal of the second NOR gate, and the control signal into a second input terminal of each of said first and second NOR gates, and to generate first and second square waves that follow the first and second clock signals when the control signal is in a high state.

The present invention also encompasses gate-drive means for interfacing logic-level control signals and active power circuit elements, comprising converter means for receiving clock and control signals and in response thereto generating isolated secondary-side power and control signals, and secondary-side drive means for converting the secondary-side control signal to a drive current for turning on or off an active power circuit. The secondary-side drive means including means for ensuring a predetermined minimum amount of dead time between a turn off and a subsequent turn on of the active power circuit element. Preferred embodiments further comprise: (i) clock means for generating first and second complementary clock signals (CLK1, CLK2) for input to the converter means, the converter means including means for receiving the clock signals and generating first and second square waves that respectively follow the clock signals when the control signal is in a predetermined state; (ii) means for transforming the square waves to isolated secondary-side signals; (iii) control means for providing a control signal (ENABLE) for turning the converter means on and off; and (iv) means for generating isolated secondary-side supply voltages (+RAIL, −RAIL), an isolated gate-drive signal (GATE), and a common reference signal (EMITTER).

The present invention also encompasses methods for generating gate-drive signals for controlling active power circuit elements. Methods in accordance with the invention comprise the steps of receiving clock and control signals and in response thereto generating isolated secondary-side power and control signals, and converting the secondary-side control signal to a drive current for turning on or off an active power circuit. The converting step includes the step of ensuring a predetermined minimum amount of dead time between a turn off and a subsequent turn on of the active power circuit element.

A preferred application of a gate-drive circuit in accordance with the present invention is to interface TTL-level signals to high voltage, MOS input switching devices. Protection against operating the MOS devices in the "linear" range is inherent due to under voltage lockout. The circuit gate-drive defaults to a safe "off" state during power-up/power-down switching conditions. The circuit has a very high common-mode dV/dt capability, surpassing that of known opto-coupler-based circuits. The circuit includes a stable and configurable "dead-time" which also serves to provide noise immunity. A drive stage is included which may be sized to drive a variety of devices with a wide range of frequencies, and from 0–100% duty cycle with isolation. The circuit is designed for very low power consumption. Other features and advantages of the present invention are described below.

BRIEF DESCRIPTION OF THE DRAWINGS

FIGS. 4A and 4B depict exemplary waveforms illustrating minimum and maximum turn-off delay (FIG. 4A) and minimum and maximum turn-on delay (FIG. 4B)

DETAILED DESCRIPTION OF THE PREFERRED EMBODIMENTS

Figure 1:
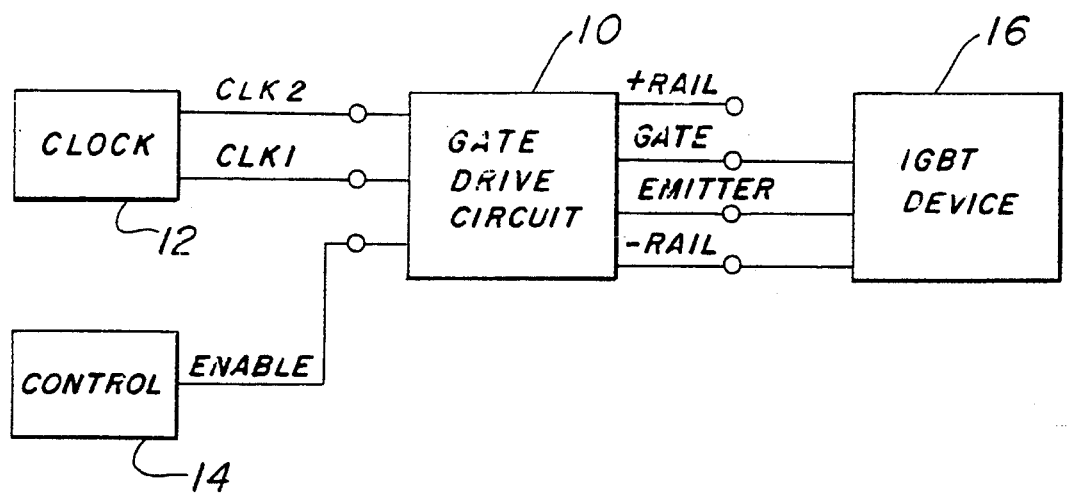
FIG. 1 is a block diagram illustrating one preferred application of a gate drive circuit in accordance with the present invention.

FIG. 1 depicts one preferred application of the present invention. In this application a gate-drive circuit 10 is used as an interface between a clock 12 and control circuit 14 and a circuit 16 comprising one or more isolated gate bipolar transistor (IGBT) devices. As described below, the clock 12 provides two complementary clock signals (CLK1, CLK2) to the gate-drive circuit 10; the control circuit provides a signal (ENABLE) for turning the gate-drive circuit on and off, and the gate-drive circuit outputs isolated supply voltages (+RAIL, −RAIL), which are typically +16 V and −16 V, respectively, a drive signal (GATE) that may be used to drive (through a resistance (not shown)) the gate of a MOS-input device of the IGBT circuit 16, and a common reference signal (EMITTER).

The gate-drive circuit 10 is described in detail below, in terms of operation (function) and structure. Brief descriptions of the clock 12 and control board 14 are also provided.

1. Description of Overall System Operation

The gate-drive circuit 10 will accept a TTL-level on/off control signal (ENABLE) from the control board 14 via a differential driver and receiver pair (not shown). This provides noise immunity, which is necessary because the controller board will not necessarily be close to the gate-drive board (e.g., in a UPS system) and the control signal may be routed through a noisy channel.

. The received control signal (ENABLE) will preferably have an appropriate "dead-time" inserted prior to being sent across an isolation boundary inside the gate-drive circuit 10. In one embodiment of the invention, the signal is sent across an isolation boundary via a 2-Mhz push-pull converter in the gate-drive circuit 10. A transformer T1 (see FIG. 3) in the gate-drive circuit provides the isolation boundary. The power required to switch the IGBT device 16 is sent through the same 2-MHz converter.

The secondary of the 2-MHz push-pull transformer T1 is referenced to the IGBT emitter (not shown). Initially, no voltage is present on this side of the converter (i.e., as described below, capacitors C16, C18 (FIG. 3) are initially discharged (or uncharged)). As the primary side circuitry receives "on" signals from the control board 14, the converter runs and charges secondary-side bulk storage capacitors C16, C18 in the gate-drive circuit. The gate voltage of the IGBT device is held off until the bulk storage capacitors are charged to a minimum value. When the capacitors have charged, the IGBT gate is turned on as the signal is received from the push-pull converter. Hysteresis is provided to insure well-defined minimum capacitor voltage levels.

A small noise immunity dead-time is provided on the secondary side of the gate-drive channel. This prevents unintentional gating due to dV/dt or other noise. The IGBT device is turned off when the control board signal disables the 2-MHz push-pull converter. The secondary-side bulk storage capacitors C16, C18 are essentially unloaded during the off state so that the secondary supply voltage will remain constant while waiting for the next on signal.

It should also be noted that no load is present (other than small leakage currents) on the secondary-side circuits when the converter is off, so capacitors C16 and C18 remain charged indefinitely.

2. Description of Individual Circuits a. Clock Circuitry

Figure 2:
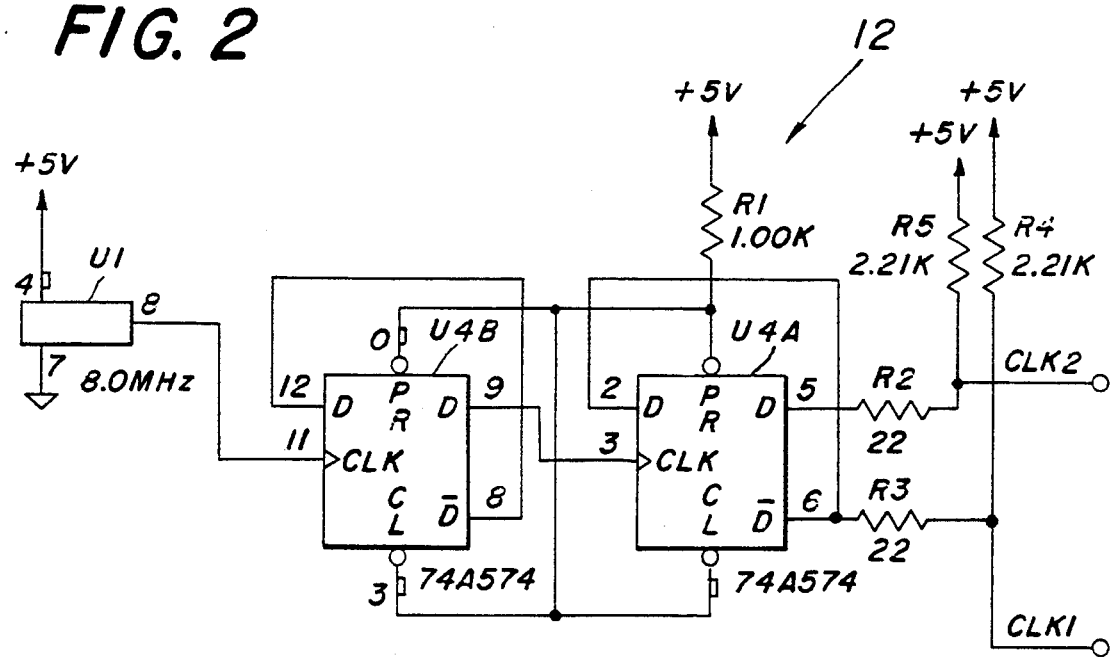
FIG. 2 is a schematic diagram of clock circuitry for use in the system of FIG. 1.

The clock circuitry 12, schematically depicted in FIG. 2, provides a complimentary 2-megahertz signal for use by the gate-drive circuit 10. The schematic component references are U1, U4A, U4B, R1, R2, R3, R4 and R5.

U1 is an 8-megahertz oscillator. U1 provides the clock signal to the CLK input of U4B, a D flip-flop configured as a divide-by-two circuit. The Q output of U4B is divided by two through U4A. The Q and Q-not outputs of U4A are input to the CLK2 and CLK1 inputs of the gate-drive circuit 10. R4 and R5 pull up Q and Q-not while providing terminations. R2 and R3 provide damping for the clock signals. U1 also provides an 8-MHz clock for PAL dead-time circuitry, described below in connection with a brief description of the control board 14.

b. Control Circuit/Dead-Time Generation

Figure 4B:
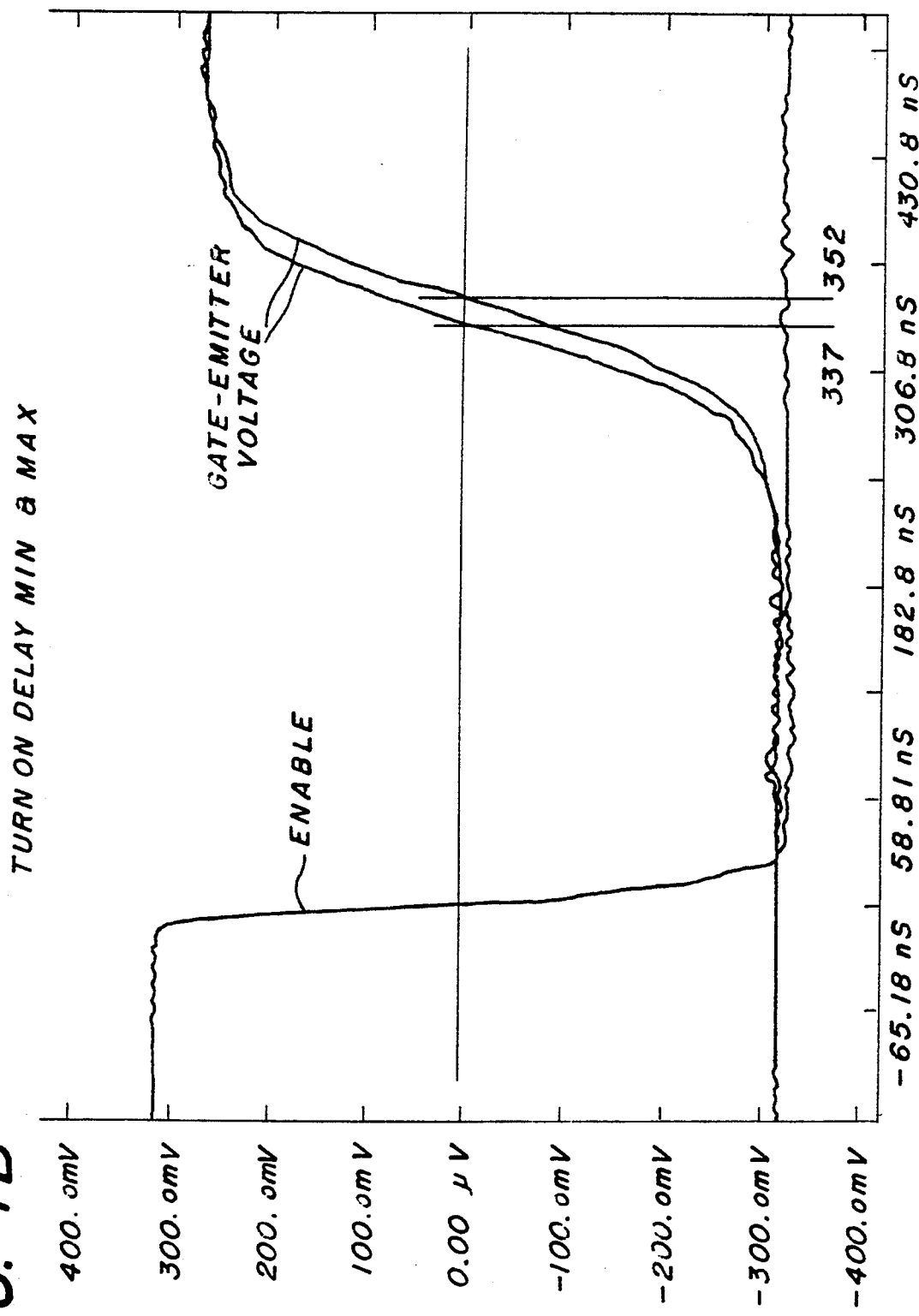

The control block 14 accepts "on" and "off" signals from an external source (not shown), adds dead-time and inputs these signals to the ENABLE input of the gate-drive circuit 12. The on signal for the IGBT device 16 is input to a 26LS31 differential driver IC in the control block. Dead-time is added through two dead-time PALS. The PALS insert a turn-on delay of between 125 and 2000 nsec. In configuring dead-time, it is important to realize that there is an additional analog delay of approximately 250 nsec provided by the secondary-side of the gate-drive circuit 10. This is illustrated by FIGS. 4A and 4B, which respectively depict waveforms illustrating minimum and maximum turn-off delay and minimum and maximum turn-on delay. Dead time is the difference between turn-on delay and turn-off delay, as illustrated by FIGS. 4A and 4B. FIG. 4A shows the delay from ENABLE to the gate-emitter voltage transition at turn off. FIG. 4B shows the delay from ENABLE to gate-emitter transition at turn on.

c. Gate-Drive Circuit

Push-Pull Converter

Figure 3:
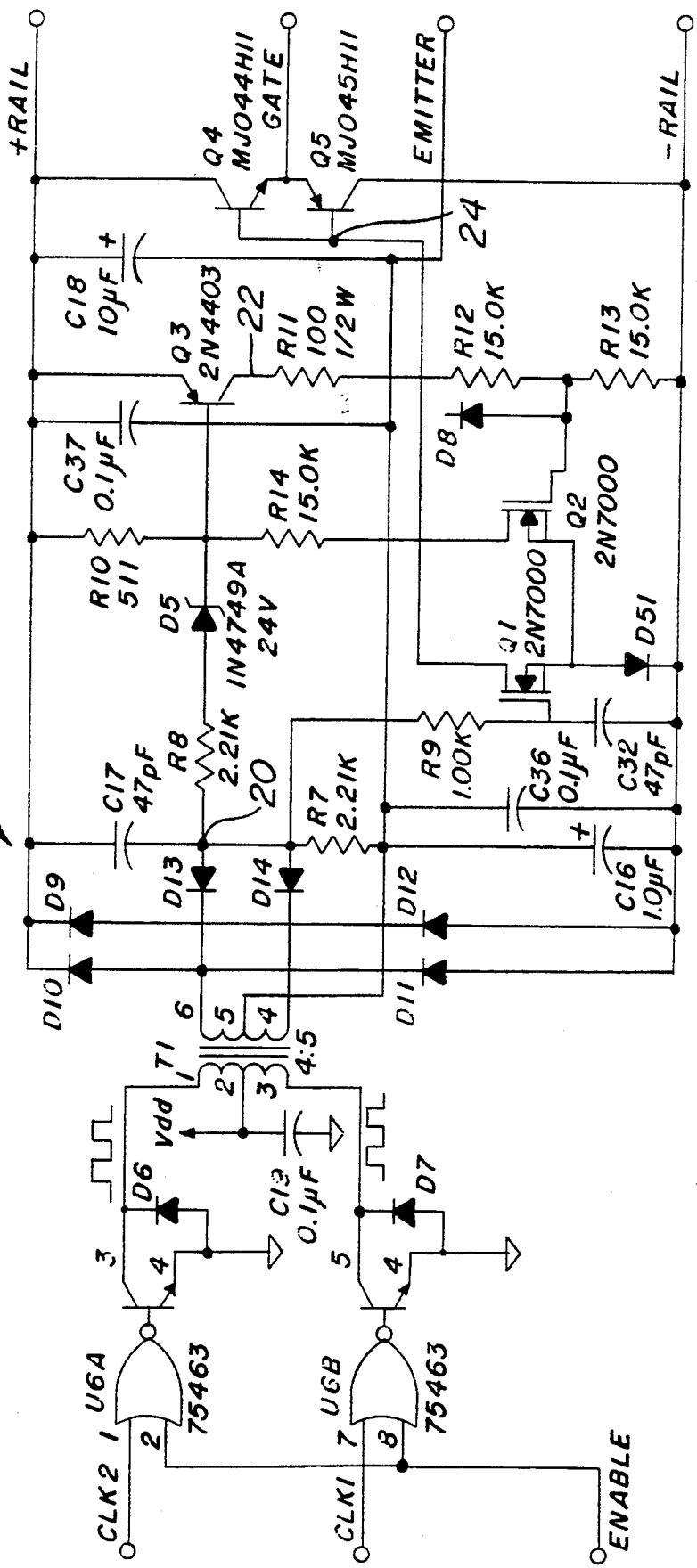
FIG. 3 is a schematic diagram of one preferred embodiment of a gate-drive circuit in accordance with the present invention.

The push-pull converter transfers the power and signal to the gate-drive secondary. Referring to FIG. 3, the schematic component references for the push-pull converter are U6A, U6B, D6, D7, C19, T1, D9-12, C16 and C18.

U6A, U6B, D6, D7 and T1 form the primary-side of the push-pull converter. Complimentary 2-megahertz clock signals CLK2, CLK1 are provided to NOR gates U6A and U6B. The converter is enabled by a low ENABLE signal. This causes the open-collector outputs of U6A, U6B to alternately go high. Two 0–12 V square-waves are provided to the transformer T1. Diodes D6 and D7 provide a path for the T1 magnetizing current. The square waves are transmitted through T1 and appear on the secondary as a 34 V peak-to-peak square wave ($\pm 17$ V from the secondary center-tap). The actual peak-to-peak voltage on the secondary will typically be less than the ideal 34 V due to leakage inductance and loading effects. The secondary voltage square wave is applied to a full-wave diode bridge formed by diodes D9–D12. The bridge rectifies the bipolar squarewave and produces $+16$ V and $-16$ V supplies for the secondary circuit. Capacitors C16 and C18 provide bulk storage capacitance.

Secondary-Side Drive Circuitry

The secondary-side drive circuitry provides the actual drive current to turn on or off the IGBT device 16 (FIG. 1) connected to the gate-drive circuit. Power-up/down protection is provided as well as a small noise immunity dead time. The schematic component references are R6-15, C17, C32, Q1-5, D3-5, D8, D13, D14, and D51. Power-up, turn-on and turn-off sequences are described below.

Power-Up Sequence

Figure 4C:
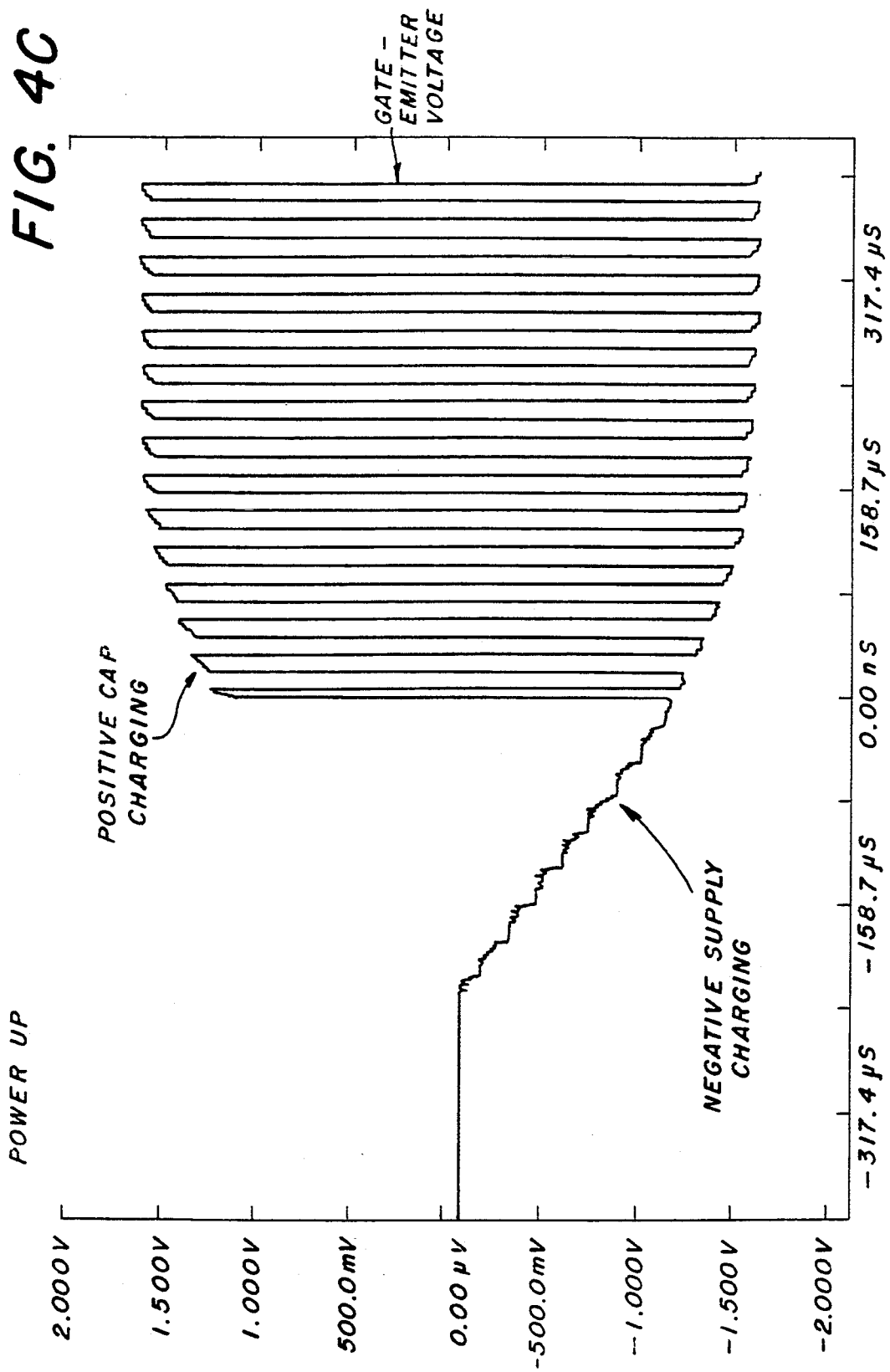
FIG. 4C depicts an example of a gate-drive signal during a power-up sequence.

The ENABLE signal, upon going low, causes the push-pull converter to operate. Initially, the secondary-side bulk filter caps C16, C18 are discharged. The operation of the push-pull converter will charge C16 and C18 through the rectifier bridge formed by diode D9–D12. The current available for charging is limited by the source impedance of VDD and the leakage inductance in T1. (C16, C18 do not charge instantaneously because the current available to charge them is finite. FIG. 4C shows how the capacitors charge as the gate drive operates.) The GATE output signal is held low during the charge-up phase through Q5, R12 and R13. The bulk caps C16, C18 will remain charged during the time that the ENABLE signal is high (off) because there is no path in which current can flow while the converter is in the off state. The bulk caps will continue to charge and the GATE output will remain off (pulled to $-$RAIL) until the caps charge to a threshold voltage determined by diode D5. FIG. 4B depicts an exemplary GATE waveform during a power-up sequence.

Turn-On Sequence

The push-pull converter operates when the ENABLE signal is pulled low. Capacitors C18 and C16 are initially charged. The voltage across transformer T1's secondary forces the voltage on node 20 to $-$RAIL through diodes D13 and D14. Two things happen with node 20 at $-$RAIL: (1) transistor Q3 is turned on through diode D5 and resistor R8 (when the supply rails are greater than the D5 Zener voltage of $+24$ V, which pulls the voltage on node 22 high ($+$RAIL), and (2) transistor Q1 is turned off through resistor R9. Capacitor C32 must be discharged from 16 V (nominal) to 1 V. This adds a turn-on delay. As Q1 turns off, node 24 is pulled up through Q3 and R11. Q4 and Q5 form an emitter-follower stage to buffer the voltage at node 24 and provide output current drive to the IGBT device 16 (FIG. 1). Hysteresis is added by elements Q2, R12, R13 and R14. As the voltage at node 24 rises, Q2 is turned-on and current is drawn through R14. As the voltage at node 24 rises, Q2 is turned-on and current is drawn through R14. This reinforces the turn-on of Q3 and removes the sensitivity to any "softness" in Zener diode D5. Capacitors C16 and C18 are recharged during the on time.

Turn-Off Sequence

The push-pull converter stops operating when the ENABLE signal is pulled high. At that time, the voltage on node 20 is pulled up to the emitter potential through R7. Capacitor C17 provides noise filtering. Transistor Q1 is turned on through R7 and R9. The time required to turn Q1 on provides a turn-off delay. With Q1 on, the voltage on node 24 is pulled to −RAIL and the output signal GATE is off. Diode D5 is off with node 20 at the EMITTER potential, so Q3 will turn off through R10. Transistor Q2 is turned off through Q1 and D8 (for speed), so the hysteresis current from R14 is removed. The time for Q3 to turn off is increased because, with Q1 on, R11 carries a high collector current through Q3. This increases the turn-off speed of Q3. Once, in the off state, no current is drawn through the bulk storage caps C16, C18 and the circuit is set for the next turn-on sequence.

Important Features

Important novel features of the gate-drive circuit 10 described above include (but are not limited to) the combination of: (1) use of a single transformer with 0–100% duty cycle; (2) absence of a drain on the supplies when the converter is idle; (3) guaranteed dead-time; (4) minimum on levels set by Zener diode D5; (5) a high speed output driver; and (6) negative gate voltage during turn off, which enhances noise immunity. In addition, the gate-drive circuit described herein is particularly adapted to provide an isolated interface between logic-level control signals (e.g., CLK1, CLK2 and ENABLE) and active power circuit elements in a switched-mode power system. More particularly, the gate-drive circuit is designed to interface TTL-level signals and IGBT power devices. Further, this specification reveals other specific features of preferred embodiments of the invention, including:

a) One or more isolated drive channels for interfacing to IGBT devices.
b) Sufficient protection to prevent damage to the inputs of IGBT devices.
c) Protection from operating the IGBT devices in the linear region.
d) All outputs default to the off state during power-up and power-down sequencing.
e) All outputs default to the off state with an "open" input signal.
f) Immunity to common-mode dV/dt up to 10 KV/$\mu$sec.
g) Stable and configurable dead-time circuitry.
h) Capability to drive 25A through 600A IGBTs at 600 V and 1200 V. (This may require high/low power versions for cost effectiveness.)
i) Capability to be employed in a UPS requiring UL, CSA, VDE and FCC regulatory approvals.
j) Capability to be operated from 0° to 45° C. ambient temperature.
k) High reliability (e.g., some embodiments of the invention are expected to exhibit 2.7 failures/$10^6$ hrs @ 25° C.).
l) Low power consumption (2 W max. for 75A modules at 25 kHz).

Finally, the scope of the following claims is intended to be commensurate with the true scope of the invention and is not intended to be limited to the specific circuitry described herein. For example, the true scope of the invention is not limited to gate-drive circuits comprising a push-pull converter of the type specified above, or to circuits comprising the specific secondary-side drive circuit described above. Moreover, the gate-drive circuit could have a full wave primary side, which would eliminate the need for a center tap on the primary of the transformer, and the secondary side of the gate-drive circuit could have a half-wave rectifier, eliminating the need for a center tap on the secondary side of the transformer. The clock frequency could also be changed.

We claim:

1. A gate-drive circuit, comprising:
    (a) a push-pull converter comprising (i) first and second gates, (ii) a transformer comprising a primary side operatively coupled to said first and second gates and a secondary side, (iii) a rectifier operatively coupled to said secondary side, and (iv) at least one storage capacitor coupled to said rectifier so as to receive charge when the converter is operating and provide positive and negative supply rails (+RAIL, −RAIL); and
    (b) a gate-drive secondary circuit providing a gate-drive output signal (GATE) at a voltage level between the levels of said positive supply rail and said negative supply rail, and comprising a first transistor (Q1) operatively coupled to said transformer, a second transistor (Q2) operatively coupled to said positive and negative supply rails, a third transistor (Q3) operatively coupled between said positive and negative supply rails and to said first and second transistors, and a Zener diode (D5) having a predetermined Zener breakdown voltage and coupled between said third transistor and said transformer so as to prevent said third transistor from turning on when the voltage on said supply rails is less than the Zener voltage.

2. Gate-drive means for interfacing logic-level control signals and active power circuit elements, comprising:
    (a) converter means for receiving clock and control signals and in response thereto generating isolated secondary-side power and control signals; and
    (b) secondary-side drive means for converting said secondary-side control signal to a drive current for turning on or off an active power circuit, said secondary-side drive means including means for ensuring a predetermined minimum amount of dead time between a turn off and a subsequent turn on of said active power circuit element.

3. Gate-drive means according to claim 2, further comprising: (i) clock means for generating first and second complementary clock signals (CLK1, CLK2) for input to said converter means, said converter means including means for receiving said clock signals and generating first and second square waves that respectively follow said clock signals when said control signal is in a predetermined state; (ii) means for transforming said square waves to isolated secondary-side signals; (iii) control means for providing a control signal (ENABLE) for turning the converter means on and off; and (iv) means for generating isolated secondary-side supply voltages (+RAIL, −RAIL), an isolated gate-drive signal (GATE), and a common reference signal (EMITTER).

4. A method for generating gate-drive signals for controlling active power circuit elements, comprising the steps of:
(a) receiving clock and control signals and in response thereto generating isolated secondary-side power and control signals; and
(b) converting said secondary-side control signal to a drive current for turning on or off an active power circuit, said converting step including the step of ensuring a predetermined minimum amount of dead time between a turn off and a subsequent turn on of said active power circuit element.

5. The method recited in claim 4, further comprising the steps of: (i) generating first and second complementary clock signals (CLK1, CLK2), said converting step (b) including receiving said clock signals and generating first and second square waves that respectively follow said clock signals when said control signal is in a predetermined state; (ii) transforming said square waves to an isolated secondary-side signal; and (iii) converting said isolated secondary-side signal to isolated secondary-side supply voltages (+RAIL, −RAIL), an isolated gate-drive signal (GATE), and a common reference signal (EMITTER).

6. A gate-drive circuit, comprising:
(a) a push-pull converter comprising (i) first and second gates, (ii) a transformer comprising a primary side operatively coupled to said first and second gates and a secondary side, (iii) a rectifier operatively coupled to said secondary side, and (iv) at least one storage capacitor coupled to said rectifier so as to receive charge when the converter is operating and provide positive and negative supply rails (+RAIL, −RAIL); and
(b) a gate-drive secondary circuit comprising first and second transistors (Q4, Q5) arranged in an emitter-follower configuration and providing a gate-drive output signal (GATE), said first transistor being coupled to said positive supply rail and said second transistor being coupled to said negative supply rail, and further comprising a third transistor (Q1) operatively coupled to said first and second transistors and to said transformer, a fourth transistor (Q2) operatively coupled to said first and second transistors and to said positive and negative supply rails, a fifth transistor (Q3) operatively coupled between said positive and negative supply rails and to said first, second, third and forth transistors, and a Zener diode (D5) having a predetermined Zener breakdown voltage and coupled between said fifth transistor and said transformer so as to prevent said fifth transistor from turning on when the voltage on said supply rails is less than the Zener voltage.

7. A gate-drive circuit as recited in claim 6, wherein said push-pull converter comprises first and second storage capacitors (C18, C16), wherein said transformer includes center taps on said primary and secondary sides, the primary-side center tap being coupled to a fixed voltage and the secondary-side center tap being coupled to a cathode of said first storage capacitor and an anode of said second storage capacitor, said second-ary-side center tap providing a common reference (EMITTER).

8. A gate-drive circuit as recited in claim 6, wherein said first and second gates are NOR gates, said push-pull converter further comprises (i) transistors coupled between the outputs of each of said NOR gates and respective terminals of the primary side of said transformer, and (ii) diodes (D6, D7) coupled between a collector and emitter of each of said transistors, and said push-pull converter is arranged to receive a first clock signal (CLK1) into a first input terminal of said first NOR gate, a second clock signal (CLK2) into a first terminal of said second NOR gate, and a control signal (ENABLE) into a second input terminal of each of said first and second NOR gates, and to generate first and second square waves that follow said first and second clock signals when said control signal is in a predetermined state.

9. A gate-drive circuit as recited in claim 6, wherein:
said push-pull converter comprises first and second storage capacitors (C18, C16) and said transformer includes center taps on said primary and secondary sides, the primary-side center tap being coupled to a fixed voltage and the secondary-side center tap being coupled to a cathode of said first storage capacitor and an anode of said second storage capacitor, said secondary-side center tap providing a common reference (EMITTER);
said first and second gates are NOR gates;
said push-pull converter further comprises (i) transistors coupled between the outputs of each of said NOR gates and respective terminals of the primary side of said transformer, and (ii) diodes (D6, D7) coupled between a collector and emitter of each of said transistors; and
said push-pull converter is arranged to receive a first clock signal (CLK1) into a first input terminal of said first NOR gate, a second clock signal (CLK2) into a first terminal of said second NOR gate, and a control signal (ENABLE) into a second input terminal of each of said first and second NOR gates, and to generate first and second square waves that follow said first and second clock signals when said control signal is in a predetermined state.

10. A gate-drive system, comprising:
(a) clock means for generating first and second complementary clock signals;
(b) a control circuit comprising means for generating a control signal; and
(c) a gate-drive circuit, coupled to said clock means and control circuit, comprising:
(i) a push-pull converter comprising square wave means for receiving said first and second clock signals and said control signal and generating first and second square waves that follow said first and second clock signals when said control signal is in a predetermined state; a transformer comprising a primary side operatively coupled to said square wave means and a secondary side; a rectifier operatively coupled to said secondary side; and first and second storage capacitors coupled to said rectifier so as to receive charge when the converter is operating and provide positive and negative supply rails; and
(ii) a gate-drive secondary circuit comprising first and second transistors providing a gate-drive output signal, said first transistor being coupled to said positive supply rail and said second transistor being coupled to said negative supply rails, wherein said gate-drive secondary circuit further comprises a third transistor operatively coupled to said first and second transistors and to said transformer, a fourth transistor operatively coupled to said first and second transistors and to said positive and negative supply rails, a fifth transistor operatively coupled between said positive and negative supply rails and to said first, second, third and forth transistors, and a Zener diode having a predetermined Zener breakdown voltage and coupled between said fifth transistor and said transformer so as to prevent said fifth transistor from turning on when the voltage on said supply rails is less than the Zener voltage.

11. A gate-drive system as recited in claim 10, wherein said transformer includes center taps on said primary and secondary sides, the primary-side center tap being coupled through a capacitor coupled to a common potential and the secondary-side center tap being coupled to a cathode of said first storage capacitor and an anode of said second storage capacitor, said secondary-side center tap providing a common reference (EMITTER).

12. A gate-drive system as recited in claim 10, wherein said clock means comprises an oscillator and first and second flip-flops, said oscillator having an output terminal coupled to a clock input of said first flip-flop, a Q output of the first flip-flop being coupled to a clock input of said second flip-flop, and Q and Q-not outputs of said second flip-flop providing said first and second complementary clock signals.

13. A gate-drive system as recited in claim 10, wherein said square wave means comprises a push-pull converter comprising first and second NOR gates, transistors coupled between the outputs of each of said NOR gates and respective terminals of the primary side of said transformer, and diodes coupled between a collector and emitter of each of said transistors; said push-pull converter being arranged to receive said first clock signal into a first input terminal of said first NOR gate, said second clock signal into a first terminal of said second NOR gate, and said control signal into a second input terminal of each of said first and second NOR gates, and to generate first and second square waves that follow said first and second clock signals when said control signal is in a high state.

* * * * *